(12) United States Patent
Okaniwa et al.

(10) Patent No.: US 8,860,165 B2
(45) Date of Patent: Oct. 14, 2014

(54) WAVELENGTH CONVERSION-TYPE PHOTOVOLTAIC CELL SEALING MATERIAL AND PHOTOVOLTAIC CELL MODULE USING THE SAME

(75) Inventors: Kaoru Okaniwa, Tsukuba (JP); Taku Sawaki, Tsukuba (JP); Takeshi Yamashita, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 14/000,860

(22) PCT Filed: Dec. 19, 2011

(86) PCT No.: PCT/JP2011/079383
§ 371 (c)(1),
(2), (4) Date: Aug. 21, 2013

(87) PCT Pub. No.: WO2012/114627
PCT Pub. Date: Aug. 30, 2012

(65) Prior Publication Data
US 2013/0328149 A1    Dec. 12, 2013

(30) Foreign Application Priority Data

Feb. 23, 2011  (JP) ................................ 2011-036964

(51) Int. Cl.
*H01L 31/0232* (2014.01)
*H01L 31/048* (2014.01)
*H01L 31/055* (2014.01)

(52) U.S. Cl.
CPC ........... *H01L 31/02322* (2013.01); *Y02E 10/50* (2013.01); *H01L 31/0481* (2013.01); *H01L 31/055* (2013.01)

USPC ................... 257/436; 257/E31.129; 136/257

(58) Field of Classification Search
USPC .......... 257/431, 436, 451, E27.123, E31.096, 257/E31.119, E31.129; 136/247, 257
See application file for complete search history.

(56) References Cited

U.S. PATENT DOCUMENTS 5,443,657 A * 8/1995 Rivenburg et al. ............ 136/253
7,888,591 B2 * 2/2011 Naum et al. .................. 136/254

(Continued)

FOREIGN PATENT DOCUMENTS

JP    2000-328053 A    11/2000
JP    2003-051605 A    2/2003

(Continued)

*Primary Examiner* — Earl Taylor
(74) *Attorney, Agent, or Firm* — Miles & Stockbridge P.C.

(57) ABSTRACT

The present invention provides a wavelength conversion-type photovoltaic cell sealing material, the sealing material including at least one light emitting layer containing a group of spherical phosphors, the group of spherical phosphors having a ratio of a median value $D_{50}$ of the group of spherical phosphors to a total thickness t of the light emitting layer of from 0.1 to 1.0, where the median value $D_{50}$ is a median value of a volume particle size distribution of the group of spherical phosphors, and an integrated value N of a number particle size distribution from $D_{25}$ to $D_{75}$ of the group of spherical phosphors being 5% or more, when $D_{25}$ is a particle size value at 25% of an integrated value of the volume particle size distribution of the group of spherical phosphors and $D_{75}$ is a particle size value at 75% of the integrated value of the volume particle size distribution of the group of spherical phosphors; and a photovoltaic cell module including the sealing material.

11 Claims, 1 Drawing Sheet

(56) References Cited

U.S. PATENT DOCUMENTS

| | | | |
|---|---|---|---|
| 2007/0290384 A1* | 12/2007 | Kodas et al. | 264/5 |
| 2009/0151785 A1* | 6/2009 | Naum et al. | 136/257 |
| 2010/0263723 A1* | 10/2010 | Allen et al. | 136/259 |
| 2012/0112165 A1* | 5/2012 | Charlton et al. | 257/21 |
| 2012/0167983 A1* | 7/2012 | Cho et al. | 136/257 |
| 2012/0300155 A1* | 11/2012 | Winkler et al. | 349/70 |
| 2013/0068299 A1* | 3/2013 | Okaniwa et al. | 136/257 |
| 2013/0145588 A1* | 6/2013 | Nakata | 29/25.01 |
| 2013/0255778 A1* | 10/2013 | Okaniwa et al. | 136/259 |
| 2013/0328149 A1* | 12/2013 | Okaniwa et al. | 257/432 |

FOREIGN PATENT DOCUMENTS

| | | | |
|---|---|---|---|
| JP | 2006-303033 A | | 11/2006 |
| JP | 2010186845 A | * | 8/2010 |
| JP | 2010202708 A | * | 9/2010 |
| JP | 2013046986 A | * | 3/2013 |

* cited by examiner

WAVELENGTH CONVERSION-TYPE PHOTOVOLTAIC CELL SEALING MATERIAL AND PHOTOVOLTAIC CELL MODULE USING THE SAME

TECHNICAL FIELD

The present invention relates to a wavelength conversion-type photovoltaic cell sealing material and a photovoltaic cell module using the sealing material.

BACKGROUND ART

Conventional crystal silicon photovoltaic cell modules are configured as follows.

That is, as a protection glass (also called cover glass) of a module surface, a tempered glass is used in consideration of resistance to shock. On one side of the tempered glass there is an asperity pattern formed by embossment to facilitate adhesion of the glass to a sealing material (which is usually a resin containing an ethylene vinyl acetate copolymer as a main component and also called filler).

In addition, the asperity pattern is formed inside, and the surface of the photovoltaic cell module is smooth. Furthermore, under the protection glass are provided a sealing material for protecting and sealing photovoltaic cell elements and tab lines, and a back film.

In JP-A-2000-328053 and the like, there have been proposed many methods in which the wavelength of light of UV region or infrared region in sunlight spectrum, which does not contribute to electricity generation, is converted using a fluorescent substance (also called light emission material) to provide a layer that emits light of a wavelength region capable of contributing to electricity generation on a light receiving side of photovoltaic cells.

In addition, JP-A No. 2006-303033 proposes a photovoltaic cell module including, between its front cover and its crystalline silicon element, a sealing material which includes a rare earth complex as a fluorescent substance.

Furthermore, conventionally, for example, as disclosed in JP-A No. 2006-303033 and JP-A No. 2003-51605, as a transparent sealing material for photovoltaic cells, there has been widely used an ethylene-vinyl acetate copolymer to which thermosetting properties have been provided.

SUMMARY OF INVENTION

Problems to be Solved by the Invention

In the photovoltaic cell module disclosed in JP-A No. 2006-303033, the molecules of the rare earth metal that is included in the sealing material as a fluorescent substance are likely to aggregate with one another, and the aggregates scatter light at the excitation wavelength and thus drastically lower the utilization efficiency of the rare earth metal as a phosphor.

The wavelength conversion-type photovoltaic cell sealing material of the present invention attempts to solve the above problem and aims to provide: a wavelength conversion-type photovoltaic cell sealing material which can prevent scattering of light at the excitation wavelength to improve the efficiency of light utilization of a photovoltaic cell module and to stably improve the efficiency of power generation; and a photovoltaic cell module including the sealing material.

Means for Solving the Problem

As a result of assiduous research aimed at solving the above problem, the inventors have found that the use of a group of spherical phosphors including spherical phosphors with a small variation in particle diameter, so as to achieve a ratio of their median particle diameter to the total thickness of the light emitting layer of the sealing material of 0.1 or more, allows light that has been efficiently wavelength converted to enter an element, and have thus completed the present invention.

The present invention will be described below.

[1] A wavelength conversion-type photovoltaic cell sealing material, the sealing material including at least one light emitting layer containing a group of spherical phosphors, the group of spherical phosphors having a ratio of a median value $D_{50}$ of the group of spherical phosphors to a total thickness t of the light emitting layer of from 0.1 to 1.0, where the median value $D_{50}$ is a median value of a volume particle size distribution of the group of spherical phosphors, and an integrated value N of a number particle size distribution from $D_{25}$ to $D_{75}$ of the group of spherical phosphors being 5% or more when $D_{25}$ is a particle size value at 25% of an integrated value of the volume particle size distribution of the group of spherical phosphors and $D_{75}$ is a particle size value at 75% of the integrated value of the volume particle size distribution of the group of spherical phosphors.

[2] The wavelength conversion-type photovoltaic cell sealing material according to [1], wherein a median particle diameter $D_{50}$ of the group of spherical phosphors is from 1 μm to 600 μm.

[3] The wavelength conversion-type photovoltaic cell sealing material according to [1] or [2], in which the light emitting layer has a total thickness of from 10 μm to 600 μm.

[4] The wavelength conversion-type photovoltaic cell sealing material according to any one of [1] to [3], in which a spherical phosphor included in the group of spherical phosphors comprises a fluorescent substance and a transparent material.

[5] The wavelength conversion-type photovoltaic cell sealing material according to any one of [1] to [4], in which the transparent material comprises at least one selected from the group consisting of an acrylic resin, a methacrylic resin, a urethane resin, an epoxy resin, a polyester, a polyethylene, and a polyvinyl chloride.

[6] The wavelength conversion-type photovoltaic cell sealing material according to any one of [1] to [5], further including a light transmissive layer other than the light emitting layer.

[7] The wavelength conversion-type photovoltaic cell sealing material according to any one of [1] to [6], wherein the sealing material has a total thickness of from 10 μm to 1000 μm.

[8] The wavelength conversion-type photovoltaic cell sealing material according to any one of [1] to [7], in which a spherical phosphor included in the group of spherical phosphors includes a fluorescent substance and a transparent material, and a content amount of the fluorescent substance in the spherical phosphor is from 0.001 parts by mass to 30 parts by mass based on 100 parts by mass of the transparent material.

[9] The wavelength conversion-type photovoltaic cell sealing material according to any one of [1] to [8], in which a spherical phosphor included in the group of spherical phosphors comprises at least one fluorescent substance selected from the group consisting of an organic fluorescent substance, an inorganic fluorescent substance, and a rare earth metal complex.

[10] The wavelength conversion-type photovoltaic cell sealing material according to any one of [1] to [9], in which a spherical phosphor included in the group of spherical phosphors comprises a rare earth metal complex as a fluorescent substance, and the rare earth metal complex is at least one selected from the group consisting of a europium complex and a samarium complex.

[11] A photovoltaic cell module, including a photovoltaic cell element and the wavelength conversion-type photovoltaic cell sealing material according to any one of [1] to [10], in which the sealing material is disposed on a light-receiving surface of the photovoltaic cell element.

Effects of the Invention

The present invention can provide: a wavelength conversion-type photovoltaic cell sealing material which can prevent scattering of light at the excitation wavelength to improve the efficiency of light utilization of a photovoltaic cell module and to stably improve the efficiency of power generation; and a photovoltaic cell module including the sealing material.

DESCRIPTION OF EMBODIMENTS

The wavelength conversion-type photovoltaic cell sealing material (hereinafter sometimes simply referred to as "sealing material") of the present invention includes at least one light emitting layer which includes a group of spherical phosphors, the group of spherical phosphors having a ratio of a median particle diameter $D_{50}$ of the group of spherical phosphors to a total thickness t of the light emitting layer ($D_{50}/t$) of from 0.1 to 1.0, where the median value $D_{50}$ is a median value of a volume particle size distribution of the group of spherical phosphors, and an integrated value N of a number particle size distribution from $D_{25}$ to $D_{75}$ of the group of spherical phosphors is 5% or more, when $D_{25}$ is the particle size value at 25% of an integrated value of the volume particle size distribution of the group of spherical phosphors and $D_{75}$ is the particle size value at 75% of the integrated value of the volume particle size distribution of the group of spherical phosphors.

According to the present invention, it has been found that the use of a group of spherical phosphors with a small variation in particle diameter as the group of the spherical phosphor included in the above light emitting layer, so as to achieve a ratio of the median particle diameter $D_{50}$ of the volume particle size distribution of the spherical phosphors to the total thickness t of the light emitting layer of from 0.1 to 1.0, allows light that has been efficiently wavelength converted to enter a cell element, thereby preventing scattering of light in the excitation wavelength range due to, for example, aggregation of a fluorescent substance in the sealing material.

Because the wavelength conversion-type photovoltaic cell sealing material of the present invention has a ratio of the median particle diameter $D_{50}$ of the volume particle size distribution of the group of spherical phosphors to the total thickness t of the light emitting layer of from 0.1 to 1.0, the individual spherical phosphors are less likely to overlap in the thickness direction of the light emitting layer. Because the sealing material of the present invention has an integrated value N of a number particle size distribution in the range of from $D_{25}$ to $D_{75}$ of at least 5%, wherein $D_{25}$ and $D_{75}$, respectively, are the particle diameter values at 25% and 75% of the volume based cumulative particle size distribution of the spherical phosphors, many of the spherical phosphors have a particle diameter close to the median particle diameter $D_{50}$, and thus the spherical phosphors have only a small variation in particle diameter.

When light falls on a photovoltaic cell module which includes this kind of sealing material, the spherical phosphors included in the light emitting layer of the sealing material disposed on the light-receiving side absorb light. If the sealing material has a ratio of the median particle diameter $D_{50}$ of the group of spherical phosphors to the total thickness t of the light emitting layer of less than 0.1, many of the spherical phosphors will overlap in the thickness direction of the light emitting layer, and the spherical phosphors in the lower region of the light emitting layer, i.e., the region further distant from the light-receiving surface, may make less of a contribution to wavelength conversion. Thus, absorption of light by the spherical phosphors is expected to be more attenuated in a lower region of the light emitting layer.

Further, reduction of variation in the particle diameter of the group of spherical phosphors included in the light emitting layer and reduction of the number of spherical phosphors with a small particle diameter allow prevention of scattering of light and enhancement of incident light transmission. As a result, more light reaches the photovoltaic cell element, and the efficiency of light utilization of the photovoltaic cell module is improved, thereby improving the efficiency of power generation.

As described above, the sealing material according to the present invention can allow efficiently wavelength-converted light to enter a cell, can improve the efficiency of light utilization of a photovoltaic cell module, and can stably improve the efficiency of power generation.

As used herein, the term "median particle diameter" means, in a volume distribution which is obtained from a particle size distribution curve, a particle diameter when the volume integration value is 50%.

Further, a large integrated value N of the particle number distribution in the range of from $D_{25}$ to $D_{75}$, wherein $D_{25}$ to $D_{75}$ means an integrated value of volume particle diameter distribution of 25% to 75% from a smaller particle diameter side, indicates that many of the spherical phosphors have a particle diameter close to the median particle diameter, while a small integrated value N indicates that many of the spherical phosphors have a smaller particle diameter than the median particle diameter.

As used herein, the term "process" encompasses not only an independent process, but a process which cannot be specifically distinguished from another process as long as the process can achieve its desired effects.

The recitation of numerical ranges by endpoints includes the lower endpoint as the minimum value and the upper endpoint as the maximum value.

In a case in which plural materials constitute a component in a composition, the amount of such a component specified in this description, unless otherwise defined, means the total amount of materials that constitute the component.

The present invention will be described below.

The photovoltaic cell module of the present invention includes at least a photovoltaic cell element and a wavelength conversion-type photovoltaic cell sealing material, the sealing material being disposed on the light-receiving surface of the photovoltaic cell element as one light transmissive layer.

The wavelength conversion-type photovoltaic cell sealing material of the present invention is used, for example, as one of the light transmissive layers of the above photovoltaic cell module and includes at least one light emitting layer which includes the spherical phosphors. Preferably, the wavelength conversion-type photovoltaic cell sealing material (hereinafter sometimes simply referred to as "sealing material") includes a support laminate which does not include the group of spherical phosphors and a light emitting laminate which includes the group of spherical phosphors.

<<Wavelength Conversion-Type Photovoltaic Cell Sealing Material>>

The sealing material of the present invention includes at least one light emitting layer that includes the group of spherical phosphors. Although the sealing material may include a single light emitting layer or two or more light emitting layers, the sealing material preferably includes a single light emitting layer that includes the group of spherical phosphors, in view of cost, ease of manufacturing, and the like.

<Particle Diameter Characteristics of Group of Spherical Phosphors>

The group of spherical phosphors included in the light emitting layer has a given relationship between the median particle diameter $D_{50}$ obtained from the volume particle size distribution and the total thickness t of the light emitting layer and a given relationship between the volume distribution and the number distribution obtained from the particle size distribution curve. In particular, the group of spherical phosphors is required to have a ratio of the median particle diameter $D_{50}$ (μm) of the volume particle size distribution of the group of spherical phosphors to the total thickness t (μm) of the light emitting layer of from 0.1 to 1.0, and to have an integrated value N of a number particle size distribution from $D_{25}$ to $D_{75}$ of the group of spherical phosphors of 5% or more, when $D_{25}$ is the particle size value at 25% of an integrated value of the volume particle size distribution of the group of spherical phosphors and $D_{75}$ is the particle size value at 75% of an integrated value of the volume particle size distribution of the group of spherical phosphors. If a group of spherical phosphors does not exhibit the given relationship between the volume distribution and the number distribution and the given relationship between the median particle diameter of the volume particle size distribution and the total thickness of the light emitting layer, sufficient prevention of scattering of light in the excitation wavelength range cannot be achieved.

The group of spherical phosphors preferably has a ratio of $D_{50}$ to the total thickness t of the light emitting layer of from 0.3 to 1.0 and more preferably from 0.5 to 1.0, in view of the efficiency of conversion of incident sunlight. If the ratio is 0.3 or more, fewer spherical phosphors tend to overlap in the thickness direction of the light emitting layer.

The group of spherical phosphors preferably has an integrated value N of a particle number distribution in the range of from $D_{25}$ to $D_{75}$ of the volume particle size distribution of 10% or more and more preferably 20% or more, in view of prevention of scattering of light and incident light transmission. If N is 10% or more, fewer spherical phosphors tend to overlap in the thickness direction of the light emitting layer, thereby preventing scattering of light and enhancing the transmission. The upper limit of the integrated value N of the number particle size distribution is not particularly critical.

The ratio of $D_{50}$ of the group of spherical phosphors to the total thickness t of the light emitting layer and the integrated value N of particle number distribution in the range of from $D_{25}$ to $D_{75}$ of the spherical phosphor can be adjusted via the group of spherical phosphors, in particular, by the conditions of the polymerization for obtaining a resin which forms the individual fluorescent particles constituting the group of spherical phosphors and the type or the usage level of each component in the polymerization. For example, reduction of the amount of a surfactant can result in a large $D_{50}$ of the spherical phosphors, while control of shear at the onset of and during the polymerization can provide a large integrated value N of a number particle size distribution.

The group of spherical phosphors preferably has a median particle diameter ($D_{50}$) of from 1 μm to 600 μm, more preferably from 50 μm to 300 μm, and still more preferably from 50 μm to 200 μm. If $D_{50}$ is 1 μm or more, the spherical phosphors have a reduced tendency to aggregate. If $D_{50}$ is 600 μm or less, the spherical phosphors are readily synthesized.

The particle size distribution curve of the group of spherical phosphors in the present invention is generally obtained by measuring the particle size distribution by a laser diffraction scattering method. In particular, the spherical phosphors are dispersed in an aqueous medium at a concentration of 10% by mass at a temperature of 25° C., and the particle size distribution is measured in the particle diameter range of from 0.04 μm to 2000 μm by a laser diffraction scattering particle size distribution analyzer (LS13320 from Beckman Coulter Inc.) to obtain the volume particle size distribution curve and the particle number distribution curve. When the volume integrated distribution curve is drawn from a smaller particle diameter side based on the obtained volume particle size distribution curve, the particle diameter value at the volume integrated value 50% is taken as the median particle diameter ($D_{50}$).

As with the median particle diameter ($D_{50}$) of the group of spherical phosphors, the integrated value N of particle number distribution in the range of from $D_{25}$ to $D_{75}$ of the spherical phosphor is obtained from the particle number distribution curve obtained by a laser diffraction scattering method.

In view of scattering of light in the excitation wavelength range and the efficiency of power generation of a photovoltaic cell module to be obtained, the group of spherical phosphors more preferably has:

(1) a median particle diameter $D_{50}$ of from 50 μm to 300 μm, a ratio of the median particle diameter $D_{50}$ to the total thickness t of the light emitting layer of from 0.5 to 1.0, and an integrated value N of number distribution 5% or more;

(2) a median particle diameter $D_{50}$ of from 50 μm to 300 μm, a ratio of the median particle diameter $D_{50}$ to the total thickness t of the light emitting layer of from 0.5 to 1.0, and an integrated value N of number distribution of 10% or more;

(3) a median particle diameter $D_{50}$ of from 50 μm to 200 μm, a ratio of the median particle diameter $D_{50}$ to the total thickness t of the light emitting layer of from 0.5 to 1.0, and an integrated value N of number distribution of 5% or more; or (4) a median particle diameter $D_{50}$ of from 50 μm to 200 μm, a ratio of the median particle diameter $D_{50}$ to the total thickness t of the light emitting layer of from 0.5 to 1.0, and an integrated value N of number distribution of 10% or more.

<Constituents of Spherical Phosphor and Method for Producing Spherical Phosphors>

Now, the spherical phosphor used for the wavelength conversion-type photovoltaic cell sealing material of the present invention (hereinafter the spherical phosphor means each spherical phosphor which constitutes the group of spherical phosphors, unless otherwise specified) and a producing method thereof will be described in detail.

The spherical phosphor is used, for example, by containing in the light emitting layer included in the wavelength conversion-type photovoltaic cell sealing material. For example, a crystal silicon photovoltaic cell cannot effectively use sunlight at a wavelength less than 400 nm and more than 1200 nm, and thus about 56% of sunlight energy does not contribute to power generation due to the spectral mismatch. In the present invention, a phosphor having good moisture resistance, good thermal resistance, good dispersion, and a given configuration with reduced concentration quenching is preferably used, and the wavelength conversion allows efficient and stable use of sunlight thereby overcoming spectral mismatch especially at the shorter wavelengths.

The spherical phosphor is not specifically limited, so long as the phosphor can convert light in the wavelength range which cannot be utilized by a usual photovoltaic cell to light in the wavelength range which can be utilized by the photovoltaic cell. In view of the efficiency of light utilization of a photovoltaic cell module, the spherical phosphor is preferably a spherical resin particle which includes a fluorescent substance and a spherical transparent material including the fluorescent substance, and more preferably a spherical resin particle which includes at least one of the fluorescent substances described below and at least one of transparent materials and which is obtained by emulsification or suspension polymerization. As used herein, "spherical" may mean that the material has a circularity of, for example, at least 0.90, the circularity obtained by measuring 1000 or more and 10000 or less particles with, for example, SYSMEX FPIA-3000 particle size and shape image analyzer from Malvern Instruments Limited, and analyzing the captured images with the analysis software. In the present invention, however, the degree of sphericity is not defined by a circularity range.

(Fluorescent Substance)

The fluorescent substance is not specifically limited, so long as the material is a compound which can convert light in the wavelength range which cannot be utilized by a usual photovoltaic cell to light in the wavelength range which can be utilized by the photovoltaic cell. For example, the fluorescent substance is preferably a compound which can convert light in the wavelength range which is utilized at a lower efficiency by a usual photovoltaic cell to light in the wavelength range which is utilized at a higher efficiency by the photovoltaic cell, and more preferably a fluorescent substance which has an excitation wavelength of 500 nm or less and a longer emission wavelength than the excitation wavelength.

The specific examples of the preferred fluorescent substance include, for example, organic fluorescent substances, inorganic fluorescent substances, and rare earth metal complexes. In view of the efficiency of wavelength conversion, the fluorescent substance is preferably at least one of the organic fluorescent substances and the rare earth metal complexes, and more preferably an organic complex of a rare earth metal. If a rare earth metal complex is used as the fluorescent substance, the utilization efficiency of the rare earth metal complex can be maximized thereby improving the effective light emission efficiency. This allows the expensive rare earth metal complex to be used in very small quantities and to contribute to power generation.

—Inorganic Fluorescent Substances—

The inorganic fluorescent substances may include, for example, $Y_2O_2S$:Eu, Mg, and Ti fluorescent particles; oxyfluoride based crystallized glass including $Er^{3+}$ ion; $SrAl_2O_4$:Eu,Dy, $Sr_4Al_{14}O_{25}$:Eu,Dy, and $CaAl_2O_4$:Eu,Dy, which are prepared by adding rare-earth elements europium (Eu) and dysprosium (Dy) to a compound of strontium oxide and aluminum oxide; and ZnS:Cu.

—Organic Fluorescent Substances—

The organic fluorescent substances may include, for example, organic dyes such as cyanine dyes, pyridine dyes, and rhodamine dyes, LUMOGEN F VIOLET 570, LUMOGEN F YELLOW 083, LUMOGEN F ORANGE 240, and LUMOGEN F RED 300 from BASF, RHODAMINE B basic dye from Taoka Chemical Co., SUMIPLAST YELLOW FL7G from Sumika Fine Chemicals Co., and MACROLEX FLUORESCENT RED G and MACROLEX FLUORESCENT YELLOW 10GN from Bayer.

—Rare Earth Metal Complex—

In view of light emission efficiency and emission wavelength, the organic complex of a rare earth metal is preferably at least one selected from the group consisting of europium complexes and samarium complexes, and more preferably a europium complex.

A ligand on the organic complex is not specifically limited and can be chosen appropriately according to the metal to be used. Especially, the ligand is preferably a ligand which can form a complex with at least one of europium and samarium.

Although the ligand is not limited in the present invention, the ligand is preferably at least one neutral ligand selected from carboxylic acid, nitrogen-containing organic compounds, nitrogen-containing aromatic heterocyclic compounds, β-diketones, and phosphine oxides.

The ligand on the rare earth complex may include β-diketones represented by the general formula: $R^1COCHR^2COR^3$, wherein $R^1$ represents an aryl group, an alkyl group, a cycloalkyl group, a cycloalkyl alkyl group, an aralkyl group, or a substituent thereof; $R^2$ represents a hydrogen atom, an alkyl group, a cycloalkyl group, a cycloalkyl alkyl group, an aralkyl group, or an aryl group; and $R^3$ represents an aryl group, an alkyl group, a cycloalkyl group, a cycloalkyl alkyl group, an aralkyl group, or a substituent thereof Specific examples of the β-diketones include acetylacetone, perfluoroacetylacetone, benzoyl-2-furanoylmethane, 1,3-di(3-pyridyl)-1,3-propanedione, benzoyltrifluoroacetone, benzoylacetone, 5-chlorosulfonyl-2-thenoyltrifluoroacetone, bis(4-bromobenzoyl)methane, dibenzoylmethane, d,d-dicamphorylmethane, 1,3-dicyano-1,3-propanedione, p-bis(4,4,5,5,6,6,6-heptafluoro-1,3-hexanedinoyl)benzene, 4,4'-dimethoxydibenzoylmethane, 2,6-dimethyl-3,5-heptanedione, dinaphthoylmethane, dipivaloylmethane, bis(perfluoro-2-propoxypropionyl)methane, 1,3-di(2-thienyl)-1,3-propanedione, 3-(trifluoroacetyl)-d-camphor, 6,6,6-trifluoro-2,2-dimethyl-3,5-hexanedione, 1,1,1,2,2,6,6,7,7,7-decafluoro-3,5-heptanedione, 6,6,7,7,8,8,8-heptafluoro-2,2-dimethyl-3,5-octanedione, 2-furyltrifluoroacetone, hexafluoroacetylacetone, 3-(heptafluorobutyryl)-d-camphor, 4,4,5,5,6,6,6-heptafluoro-1-(2-thienyl)-1,3-hexanedione, 4-methoxydibenzoylmethane, 4-methoxybenzoyl-2-furanoylmethane, 6-methyl-2,4-heptanedione, 2-naphthoyltrifluoroacetone, 2-(2-pyridyl)benzimidazole, 5,6-dihydroxy-1,10-phenanthroline, 1-phenyl-3-methyl-4-benzoyl-5-pyrazole, 1-phenyl-3-methyl-4-(4-butylbenzoyl)-5-pyrazole, 1-phenyl-3-methyl-4-isobutyryl-5-pyrazole, 1-phenyl-3-methyl-4-trifluoroacetyl-5-pyrazole, 3-(5-phenyl-1,3,4-oxadiazol-2-yl)-2,4-pentanedione, 3-phenyl-2,4-pentanedione, 3-[3',5'-bis(phenylmethoxy)phenyl]-1-(9-phenanthyl)-1-propan-1,3-dione, 5,5-dimethyl-1,1,1-trifluoro-2,4-hexanedione, 1-phenyl-3-(2-thienyl)-1,3-propanedione, 1-(4-fluorophenyl)-3-(2-thienyl)-1,3-propanedione (FTP), 3-(t-butylhydroxymethylene)-d-camphor, 1,1,1-trifluoro-2,4-pentanedione, 1,1,1,2,2,3,3,7,7, 8,8,9,9,9-tetradecafluoro-4,6-nonanedione, 2,2,6,6-tetramethyl-3,5-heptanedione, 4,4,4-trifluoro-1-(2-naphthyl)-1,3-butanedione, 1,1,1-trifluoro-5,5-dimethyl-2,4-hexanedione, 2,2,6,6-tetramethyl-3,5-heptanedione, 2,2,6,6-tetramethyl-3,5-octanedione, 2,2,6-trimethyl-3,5-heptanedione, 2,2,7-trimethyl-3,5-octanedione, 4,4,4-trifluoro-1-(thienyl)-1,3-butanedione (TTA), 1-(p-t-butylphenyl)-3-(N-methyl-3-pyrrole)-1,3-propanedione (BMPP), 1-(p-t-butylphenyl)-3-(p-methoxyphenyl)-1,3-propanedione (BMDBM), 1,3-diphenyl-1,3-propanedione, benzoylacetone, dibenzoylacetone, diisobutyroylmethane, dipivaloylmethane, 3-methylpentan-2,4-dione, 2,2-dimethylpentan-3,5-dione, 2-methyl-1,3-butanedione, 1,3-butanedione, 3-phenyl-2,4-pentanedione, 1,1,1-trifluoro-2,4-pentanedione, 1,1,1-trifluoro-5,5-dimethyl-2,4-hexanedione, 2,2,6,6-tetramethyl-3,5-heptanedione, 3-methyl-2,4-pentanedione, 2-acetylcyclopentanone, 2-acetylcyclohexanone, 1-heptafluoropropyl-3-t-butyl-1,3-propanedione, 1,3-diphenyl-2-methyl-1,3-propanedione, and 1-ethoxy-1,3-butanedione.

The nitrogen-containing organic compounds, the nitrogen-containing aromatic heterocyclic compounds, and phosphine oxides as the neutral ligand on the rare earth complex include, for example, 1,10-phenanthroline, 2-2'-bipyridyl, 2-2'-6,2"-terpyridyl, 4,7-diphenyl-1,10-phenanthroline, 2-(2-pyridyl) benzimidazole, triphenylphosphine oxide, tri-n-butylphosphine oxide, tri-n-octylphosphine oxide, and tri-n-butyl phosphate.

In view of the efficiency of wavelength conversion, the preferred rare earth complexes including the ligand as described above include, for example, Eu(FTP)$_3$Phen ((1,10-phenanthroline)tris[1-(4-fluorophenyl)-3-(2-thienyl)-1,3-propanedionate]europium(III)), Eu(TTA)$_3$phen ((1,10-phenanthroline)tris[4,4,4-trifluoro-1-(2-thienyl)-1,3-butanedionate]europium(III)), Eu(BMPP)$_3$phen ((1,10-phenanthroline)tris[1-(p-t-butylphenyl)-3-(N-methyl-3-pyrrole)-1,3-propanedionate]europium(III))), and Eu(BMDBM)$_3$phen ((1,10-phenanthroline)tris[1-(p-t-butylphenyl)-3-(p-methoxyphenyl)-1,3-propanedionate]europium(III))).

A producing method of the Eu(TTA)$_3$Phen can be seen, for example, in Masaya Mitsuishi, Shinji Kikuchi, Tokuji Miyashita, Yutaka Amano, J. Mater. Chem. 2003, 13, 285-2879. The Eu (FTP)$_3$Phen can be produced according to a producing method of the Eu(TTA)$_3$Phen.

In the present invention, use of, especially, a europium complex as the fluorescent substance allows provision of a photovoltaic cell module with a higher efficiency of power generation. The europium complexes convert light in the UV-range to light in the IR wavelength range at a high efficiency of wavelength conversion, and the converted light contributes to power generation by a photovoltaic cell element.

(Transparent Material)

The fluorescent substance is preferably included in a transparent material. In the present invention, the "transparent" refers to a material which has a light transmission at a wavelength of from 400 nm to 800 nm of at least 90% for a pathlength of 1 cm.

The transparent material is not specifically limited, so long as the material is transparent. Examples of the transparent material may include, for example, resins such as acrylic resins, methacrylic resins, urethane resins, epoxy resins, polyester, polyethylene, and polyvinyl chloride. Among them, acrylic resins and methacrylic resins are preferred in view of prevention of light scattering. Although the monomer compound which constitutes such resin is not specifically limited, a vinyl compound is preferred in view of prevention of light scattering.

A method for including the fluorescent substance in the transparent material to make the particles spherical includes, for example, a method of dissolving or dispersing the fluorescent substance in the monomer compound to prepare a composition and then polymerizing (emulsion polymerizing or suspension polymerizing) the composition. In particular, for example, a mixture which includes the fluorescent substance and the vinyl compound (hereinafter also referred to as "vinyl compound composition") is prepared, and then the vinyl compound included in the emulsion or the suspension is polymerized (emulsion polymerized or suspension polymerized) using, for example, a radical polymerization initiator to provide spherical phosphors as spherical resin particles which include the fluorescent substance.

In view of the efficiency of power generation, it is preferred, in the present invention, to prepare a mixture which includes the fluorescent substance and the vinyl compound (vinyl compound composition); disperse the composition in a medium (for example, an aqueous medium) to give a suspension; polymerize (suspension polymerize) the vinyl compound included in the suspension using, for example, a radical polymerization initiator to provide spherical phosphors as spherical resin particles which includes the fluorescent substance.

(Vinyl Compound)

The vinyl compound is not specifically limited, so long as the compound has at least one ethylenically unsaturated bond. An acrylic monomer, a methacryl monomer, an acrylic oligomer, a methacryl oligomer, and the like which can form a vinyl resin, especially, an acrylic resin or methacrylic resin after polymerization can be used without limitation. In the present invention, it is preferred to use the acrylic monomer, the methacryl monomer, and the like.

Examples of the acrylic monomer and the methacryl monomer include, for example, acrylic acids, methacryl acids, and alkyl esters thereof. Another vinyl compound which is copolymerizable with such monomer may be combined, and such another compound may be used individually or in combination of two or more thereof.

The acrylic acid alkyl esters and the methacryl acid alkyl esters include, for example, unsubstituted alkyl esters of acrylic acid and unsubstituted alkyl ester of methacryl acid such as methyl acrylate, methyl methacrylate, ethyl acrylate, ethyl methacrylate, butyl acrylate, butyl methacrylate, acrylic acid 2-ethyl hexyl, and methacryl acid 2-ethyl hexyl; dicyclopentenyl (meth)acrylate; tetrahydrofurfuryl (meth)acrylate; benzyl (meth)acrylate; compounds obtained by reacting a polyhydric alcohol with an α,β-unsaturated carboxylic acid (for example, polyethylene glycol di(meth)acrylate (with 2-14 ethylene groups), trimethylolpropane di(meth)acrylate, trimethylolpropane tri(meth)acrylate, trimethylolpropane ethoxy tri(meth)acrylate, trimethylolpropane propoxy tri(meth)acrylate, tetramethylolmethane tri(meth)acrylate, tetramethylolmethane tetra(meth)acrylate, polypropylene glycol di(meth)acrylate (with 2-14 propylene groups), dipentaerythritol penta(meth)acrylate, dipentaerythritol hexa (meth)acrylate, bisphenol A polyoxyethylene di(meth)acrylate, bisphenol A dioxyethylene di(meth)acrylate, bisphenol A trioxyethylene di(meth)acrylate, and bisphenol A decaoxyethylene di(meth)acrylate); compounds obtained by adding an α,β-unsaturated carboxylic acid to a glycidyl group containing compound (for example, trimethylolpropane triglycidyl ether triacrylate, and bisphenol A diglycidyl ether diacrylate); esters of a polycarboxylic acid (for example, phthalic anhydride) and a material which includes a hydroxyl group and an ethylenically unsaturated group (for example, β-hydroxy ethyl (meth)acrylate); urethane (meth)acrylates (for example, the reaction product of tolylenediisocyanate with 2-hydroxy ethyl (meth)acrylate, and the reaction product of trimethylhexamethylene diisocyanate, cyclohexanedimethanol, and 2-hydroxy ethyl (meth)acrylate); and substituted alkyl esters of acrylic acid and substituted alkyl esters of methacryl acid in which the alkyl group is substituted with a group such as a hydroxyl group, an epoxy group, and a halogen group.

Examples of the another vinyl compound copolymerizable with acrylic acid, methacryl acid, acrylic acid alkyl esters, or methacryl acid alkyl esters include acrylamide, acrylonitrile, diacetone acrylamide, styrene, vinyltoluene, and the like. These vinyl monomers may be used individually or in combination of two or more thereof The vinyl compound in the present invention can be chosen appropriately such that the resin particles to be formed have a desired refractive index. It is preferred to use at least one selected from acrylic acid alkyl esters and methacryl acid alkyl esters.

(Radical Polymerization Initiator)

It is preferred to use a radical polymerization initiator to polymerize the vinyl compound. The radical polymerization initiator is not specifically limited, and any radical polymerization initiators which are commonly employed can be used. Preferred examples of the initiator include peroxides, including, in particular, organic peroxides and azo radical initiators which generate a free radical by thermolysis.

The organic peroxides include, for example, isobutyl peroxide, α,α'-bis(neodecanoylperoxy)diisopropylbenzene, cumyl peroxyneodecanoate, di-n-propyl peroxydicarbonate, di-s-butyl peroxydicarbonate, 1,1,3,3-tetramethylbutyl neodecanoate, bis(4-t-butyl cyclohexyl)peroxydicarbonate, 1-cyclohexyl-1-methylethyl peroxyneodecanoate, di-2-ethoxyethyl peroxydicarbonate, di(ethylhexyl)peroxydicarbonate, t-hexyl neodecanoate, dimethoxybutyl peroxydicarbonate, di(3-methyl-3-methoxybutyl)peroxydicarbonate, t-butyl peroxyneodecanoate, t-hexyl peroxy pivalate, 3,5,5-trimethylhexanoyl peroxide, octanoyl peroxide, lauroyl peroxide, stearoyl peroxide, 1,1,3,3-tetramethylbutyl peroxy-2-ethylhexanoate, succinic peroxide, 2,5-dimethyl-2,5-di(2-ethylhexanoyl)hexane, 1-cyclohexyl-1-methylethyl peroxy-2-ethylhexanoate, t-hexylperoxy-2-ethylhexanoate, 4-methylbenzoyl peroxide, t-butyl peroxy-2-ethylhexanoate, m-toluoyl benzoyl peroxide, benzoyl peroxide, t-butyl peroxy isobutyrate, 1,1-bis(t-butyl peroxy)2-methylcyclohexane, 1,1-bis(t-hexylperoxy)-3,3,5-trimethylcyclohexane, 1,1-bis(t-hexylperoxy)cyclohexane, 1,1-bis(t-butyl peroxy)-3,3,5-trimethylcyclohexane, 1,1-bis(t-butyl peroxy)cyclohexanone, 2,2-bis(4,4-dibutyl peroxycyclohexyl)propane, 1,1-bis(t-butyl peroxy)cyclododecane, t-hexylperoxy isopropyl monocarbonate, t-butyl peroxy maleic acid, t-butyl peroxy-3,5,5-trimethyl hexanoate, t-butyl peroxy laurate, 2,5-dimethyl-2,5-di(m-toluoylperoxy)hexane, t-butyl peroxy isopropyl monocarbonate, t-butyl peroxy-2-ethylhexyl monocarbonate, t-hexyl peroxy benzoate, 2,5-dimethyl-2,5-di(benzoylperoxy)hexane, t-butyl peroxy acetate, 2,2-bis(t-butyl peroxy)butane, t-butyl peroxy benzoate, n-butyl-4,4-bis (t-butyl peroxy)valerate, di-t-butyl peroxy isophthalate, α,α'-bis(t-butyl peroxy)diisopropyl benzene, dicumyl peroxide, 2,5-dimethyl-2,5-di(t-butyl peroxy)hexane, t-butyl cumyl peroxide, di-t-butyl peroxy, p-menthane hydroperoxide, 2,5-dimethyl-2,5-di(t-butyl peroxy)hexane, diisopropyl benzene hydroperoxide, t-butyl trimethylsilyl peroxide, 1,1,3,3-tetramethylbutyl hydroperoxide, cumene hydroperoxide, t-hexyl hydroperoxide, t-butyl hydroperoxide, and 2,3-dimethyl-2,3-diphenylbutane.

The azo radical initiators include, for example, azobisisobutyronitrile (AIBN, also known as V-60), 2,2'-azobis(2-methylisobutyronitrile) (also known as V-59), 2,2'-azobis(2,4-dimethyl valeronitrile) (also known as V-65), dimethyl-2,2'-azobis(isobutyrate) (also known as V-601), and 2,2'-azobis (4-methoxy-2,4-dimethyl valeronitrile) (also known as V-70).

The usage level of the radical polymerization initiator can be chosen appropriately according to the type of the vinyl compound, the refractive index of the resin particles to be formed, and the like. The initiator may be used in a conventional amount. In particular, for example, the initiator can be used in an amount of from 0.01 parts by mass to 2 parts by mass and preferably from 0.1 parts by mass to 1 part by mass based on 100 parts by mass of the vinyl compound.

Although the refractive index of the transparent material in the present invention is not specifically limited, the transparent material has preferably a lower refractive index than the refractive index of the fluorescent substance, and more preferably, a lower refractive index than the refractive index of the fluorescent substance, and a ratio of its refractive index to the refractive index of the sealing resin described below of about 1, in view of prevention of light scattering. Because generally, the fluorescent substance has a refractive index of more than 1.5, and the sealing resin has a refractive index of about from 1.4 to 1.5, the transparent material has preferably a refractive index of from 1.4 to 1.5.

The spherical phosphor preferably has a higher refractive index than the refractive index of the sealing resin which is to be a dispersing medium at the excitation wavelength of the fluorescent substance and a lower refractive index than the refractive index of the sealing resin at the emission wavelength. This can provide further improvement in the light utilization efficiency in the excitation wavelength range.

<Method for Producing Spherical Phosphors>

A method of including the fluorescent substance and an optional radical scavenger in the transparent material to make the fluorescent substance spherical thereby producing the spherical phosphors includes, for example, dissolving or dispersing the fluorescent substance and the optional radical scavenger in the monomer compound to prepare a composition, and polymerizing (emulsion polymerizing or suspension polymerizing) the composition. In particular, for example, a mixture which includes the fluorescent substance, the vinyl compound, and the optional radical scavenger is prepared, and then the mixture is emulsified or dispersed in a medium (for example, an aqueous medium) to give an emulsion or a suspension. The vinyl compound included in the emulsion or the suspension can be polymerized (emulsion polymerized or suspension polymerized) using, for example, a radical polymerization initiator to give the spherical phosphors as spherical resin particles which include the fluorescent substance.

In the present invention, it is preferred, in view of the efficiency of power generation, to prepare a mixture which includes the fluorescent substance and the vinyl compound, disperse the mixture in a medium (for example, an aqueous medium) to give a suspension, and polymerize (suspension polymerize) the vinyl compound included in the suspension using, for example, a radical polymerization initiator to give the spherical phosphors as spherical resin particles which include the fluorescent substance.

A method of mixing the above components is not specifically limited. For example, the components may be stirred using ultrasonic mixing, a mixing rotor, a magnetic stirrer, or a stirring blade.

Appropriate adjustment of the stirring conditions in the suspension polymerization reaction allows desired shear to be applied to the entire reaction system and thus allows the cumulative particle number distribution N of the spherical phosphors to be adjusted to within the predetermined range.

The polymerization conditions can be chosen appropriately according to the vinyl compound used and the radical polymerization initiator used, and may be adjusted based on the conventional polymerization conditions.

The state of the polymer to be produced can be chosen according to the glass transition temperature. In a case in which a compound with a high glass transition temperature such as, for example, methyl methacrylate is used, a mixture of the fluorescent substance and the radical polymerization initiator can be suspended in a surfactant added to water kept at a predetermined temperature to give a particulate polymer (suspension polymerization). Alternatively, the type of the surfactant can be changed appropriately to more finely suspend the mixture thereby providing finer particles (emulsion polymerization).

In a case in which a compound with a lower glass transition temperature than room temperature such as, for example, butyl acrylate is used, the mixture of the fluorescent substance and the radical polymerization initiator can be polymerized directly in a container such as a flask to give a polymer with a high viscosity.

Suitable examples of the radical polymerization initiator include, for example, organic peroxides such as lauroylperoxide. In a case in which the lauroylperoxide is used, the monomer compound is preferably polymerized at a temperature of from 50° C. to 60° C.

The surfactant used in the polymerization can be a known surfactant, including anionic surfactants, nonionic surfactant, and the like. It is preferred to use a nonionic surfactant in view of the stability of the particles. Examples of the nonionic surfactant include polyvinyl alcohol, polyvinyl pyrrolidone, and methylcellulose. The surfactant is preferably used in an amount of from 0.01% by mass to 10% by mass and more preferably from 0.1% by mass to 5% by mass based on the total mass of the monomer, in view of control of the particle diameter of the spherical phosphors.

<Light Emitting Layer>

The light emitting layer is a light transmissive resin composition layer which has wavelength conversion capability, the layer including the spherical phosphors dispersed in the transparent sealing resin.

Use, as one of the light transmissive layers of a photovoltaic cell module, of the wavelength conversion-type photovoltaic cell sealing material, the sealing material including the light emitting layer which includes the spherical phosphors allows improvement in the efficiency of light utilization and stable improvement in the efficiency of power generation.

The light emitting layer which includes the spherical phosphors preferably has a total thickness t of from 10 μm to 600 μm, more preferably from 50 μm to 300 μm, and still more preferably from 50 μm to 200 μm, in view of the efficiency of wavelength conversion.

The total thickness t of the light emitting layer is determined by measuring the thickness of the sealing material at 5 points using MDH-25M HIGH-ACCURACY DIGIMATIC MICROMETER from Mitutoyo Corp., and averaging the measurements.

Desirably, the concentration of the fluorescent substance in the spherical phosphor is adjusted appropriately according to the type of the fluorescent substance and the like. Generally, the fluorescent substance is included in the spherical phosphor in an amount of preferably from 0.001 parts by mass to 30 parts by mass and more preferably from 0.01 parts by mass to 10 parts by mass based on 100 parts by mass of the transparent material. Inclusion of 0.001 parts by mass or more of the fluorescent substance can provide higher efficiency of wavelength conversion, while inclusion of 30 parts by mass or less of the fluorescent substance can better prevent reduction in the amount of light that reaches a photovoltaic cell.

The light scattering correlates with the ratio of the refractive index of the spherical phosphor, i.e., the sphere in the transparent sealing resin described below, to the refractive index of the transparent sealing resin. In particular, when a ratio of the refractive index of the sphere to the refractive index of the transparent sealing resin is about "1", the light scattering is small. Especially in a case in which the present invention is applied to a photovoltaic cell module, the ratio of the refractive index is preferably about "1" in the wavelength range which can be utilized by a photovoltaic cell element, i.e., the wavelength range of from 400 nm to 1200 nm. On the other hand, the refractive index in the spherical phosphor is preferably higher than the refractive index of the sealing resin, which is a medium in the excitation wavelength range, in order to efficiently provide, in the spherical phosphor, for total internal reflection of light in the excitation wavelength range.

To meet such requirement, for example, use of a europium complex such as, for example, $Eu(FTP)_3phen$ as the fluorescent substance, polymethyl methacrylate as the transparent material (mother material of the sphere), and ethylene-vinyl acetate copolymer (EVA) as the sealing resin may provide the best refractive index correlation in view of the excitation wavelength, the emission wavelength, and the sensitivity of a photovoltaic cell. In the present invention, however, it is preferred to appropriately choose the fluorescent substance, the transparent material, and the sealing resin to meet the respective requirements for refractive index correlation as described above, and the invention is not restricted by the above combination.

(Sealing Resin)

The light emitting layer with wavelength conversion capability in the present invention includes a sealing resin (transparent sealing resin). Preferred examples of the transparent sealing resin include, for example, photocurable resins, thermosetting resins, and thermoplastic resins.

Conventionally, an ethylene-vinyl acetate copolymer (EVA) provided with thermosetting properties has been commonly used as the transparent sealing resin for a transparent sealing material for a photovoltaic cell, as described in JP-A No. 2006-303033 mentioned above, although the present invention is not limited to such EVA.

In a case in which a photocurable resin is used as the transparent sealing resin, the composition of the photocurable resin and the light curing method are not specifically limited. For example, in the light curing method using a photo radical initiator, the resin composition for the wavelength conversion-type photovoltaic cell sealing material includes a dispersing medium resin which includes (A) a photocurable resin, (B) a crosslinking monomer, and (C) a photo initiator which generates a free radical by thermolysis in addition to the spherical phosphors as described above.

The (A) photocurable resin includes a copolymer obtained by copolymerizing acrylic acid or methacryl acid and alkyl esters thereof with another vinyl monomer which is copolymerizable therewith. Such copolymer may be used individually, or in combination of two or more thereof. Examples of the acrylic acid alkyl ester or the methacryl acid alkyl ester include, for example, unsubstituted alkyl esters of acrylic acid or unsubstituted alkyl esters of methacryl acid such as methyl acrylate, methyl methacrylate, ethyl acrylate, ethyl methacrylate, butyl acrylate, butyl methacrylate, 2-ethylhexylacrylate, and 2-ethyl hexyl methacrylate; and substituted alkyl esters of acrylic acid or substituted alkyl esters of methacryl acid in which the alkyl group is substituted with a group such as a hydroxyl group, an epoxy group, and a halogen group.

Examples of the another vinyl monomer copolymerizable with acrylic acid, methacryl acid, acrylic acid alkyl esters, or methacryl acid alkyl esters include, for example, acrylamide, acrylonitrile, diacetoneacrylamide, styrene, and vinyltoluene. These vinyl monomers may be used individually, or in combination of two or more thereof. The (A) component of the dispersing medium resin preferably has a weight-average molecular weight of from 10,000 to 300,000 in view of coating performance and coating strength.

Examples of the (B) crosslinking monomer may include compounds obtained by reacting a polyhydric alcohol with an α,β-unsaturated carboxylic acid (for example, polyethylene glycol di(meth)acrylate (with 2-14 ethylene groups), trimethylolpropane di(meth)acrylate, trimethylolpropane tri(meth)acrylate, trimethylolpropane ethoxy tri(meth)acrylate, trimethylolpropane propoxy tri(meth)acrylate, tetramethylolmethane tri(meth)acrylate, tetramethylolmethane tetra(meth)acrylate, polypropylene glycol di(meth)acrylate (with 2-14 propylene groups), dipentaerythritol penta(meth)acrylate, dipentaerythritol hexa(meth)acrylate, bisphenol A polyoxyethylene di(meth)acrylate, bisphenol A dioxyethylene di(meth)acrylate, bisphenol A trioxyethylene di(meth)acrylate, and bisphenol A decaoxyethylene di(meth)acrylate); compounds obtained by adding an α,β-unsaturated carboxylic acid to a glycidyl group containing compound (for example, trimethylolpropane triglycidyl ether triacrylate, and bisphenol A diglycidyl ether diacrylate); esters of a polycarboxylic acid (for example, phthalic anhydride) and a material which includes a hydroxyl group and an ethylenically unsaturated group (for example, (3-hydroxy ethyl (meth)acrylate); and urethane (meth)acrylates (for example, the reaction product of tolylenediisocyanate with 2-hydroxy ethyl (meth)acrylate, and the reaction product of trimethylhexamethylene diisocyanate, cyclohexanedimethanol, and 2-hydroxy ethyl (meth)acrylate).

Especially preferred examples of the (B) crosslinking monomer include trimethylolpropane tri(meth)acrylate, dipentaerythritol tetra(meth)acrylate, dipentaerythritol hexa(meth)acrylate, and bisphenol A polyoxyethylene dimethacrylate due to the crosslinking density and the ease of control of the reaction. These compounds are used individually or in combination of two or more thereof.

As described below, the (A) photocurable resin and/or the (B) crosslinking monomer advantageously include bromine and sulfur atoms, especially in a case in which the wavelength conversion-type photovoltaic cell sealing material or a lower layer thereof (the side contacting the photovoltaic cell element) has a high refractive index. Examples of the bromine containing monomer include, for example, NEW FRONTIER BR-31, NEW FRONTIER BR-30, and NEW FRONTIER BR-42M from Dai-Ichi Kogyo Seiyaku Co., Ltd. Examples of the sulfur containing monomer composition include IU-L2000, IU-L3000, and IU-MS1010 from Mitsubishi Gas Chemical Co., Inc. It should be noted that the bromine containing and the sulfur containing monomers used in the present invention (and polymer including the monomers) are not limited to the monomers listed herein.

The (C) photo initiator is preferably a photo initiator which generates a free radical when the initiator is exposed to UV or visible radiation. Preferred examples of the initiator include, for example, benzoin ethers such as benzoin methyl ether, benzoin ethyl ether, benzoin propyl ether, benzoin isobutyl ether, and benzoin phenyl ether; benzophenones such as benzophenone, N,N'-tetramethyl-4,4'-diaminobenzophenone (Michler's ketone) and N,N'-tetraethyl-4,4'-diaminobenzophenone; benzyl ketals such as benzyl dimethyl ketal (IRGACURE 651 from BASF Japan Ltd.) and benzyl diethyl ketal; acetophenones such as 2,2-dimethoxy-2-phenylacetophenone, p-tert-butyldichloroacetophenone, and p-dimethylaminoacetophenone; xanthones such as 2,4-dimethylthioxanthone and 2,4-diisopropylthioxanthone; hydroxycyclohexyl phenyl ketone (IRGACURE 184 from BASF Japan Ltd.); 1-(4-isopropylphenyl)-2-hydroxy-2-methylpropan-1-one (DAROCUR 1116 from BASF Japan Ltd.); and 2-hydroxy-2-methyl-1-phenylpropan-1-one (DAROCUR 1173 from BASF Japan Ltd.). These initiators are used individually or in combination of two or more thereof.

Another example of the (C) photo initiator which may be used includes, for example, a combination of a 2,4,5-triarylimidazole dimer and 2-mercaptobenzoxazole, Leuco Crystal Violet, tris(4-diethylamino-2-methylphenyl)methane, or the like. Additionally, an additive which does not have photoinitiating properties by itself, but which can form a photosensitizer system with better photoinitiating properties when the additive is combined with the materials as described above, the additive including, for example, tertiary amines such as triethanolamine combined with the benzophenones.

To impart thermosetting properties to the sealing resin, the (C) photo initiator may be changed to a thermal initiator.

Preferred examples of the (C) thermal initiator include organic peroxides which generate a free radical by thermolysis. For example, the organic peroxides may include the same organic peroxides as the peroxides listed above as the radical polymerization initiator used for providing the spherical phosphors.

Although the acrylic photocurable resins and thermosetting resins are listed above, photocurable epoxy resins and thermosetting resins which are commonly employed can also be used as the transparent sealing resin for the wavelength conversion-type photovoltaic cell sealing material of the present invention. In view of the affects on rare earth metal complex which is the spherical phosphors or the fluorescent substance, an acrylic resin is preferred.

In a case in which a thermoplastic resin which flows by heating or application of pressure is used as the transparent sealing resin for the wavelength conversion-type photovoltaic cell sealing material, for example, a natural rubber; a (di)ene such as polyethylene, polypropylene, polyvinyl acetate, polyisoprene, poly-1,2-butadiene, polyisobutene, polybutene, poly-2-heptyl-1,3-butadiene, poly-2-t-butyl-1,3-butadiene, and poly-1,3-butadiene; a polyether such as polyoxyethylene, polyoxypropylene, polyvinyl ethylether, polyvinyl hexylether, and polyvinyl butylether; a polyester such as polyvinyl acetate and polyvinyl propionate; and a poly(meth)acrylic ester such as polyurethane, ethylcellulose, polyvinyl chloride, polyacrylonitrile, polymethacrylonitrile, polysulfone, a phenoxy resin, polyethylacrylate, polybutylacrylate, poly-2-ethylhexylacrylate, poly-t-butylacrylate, poly-3-ethoxypropyl acrylate, polyoxycarbonyl tetramethacrylate, polymethyl acrylate, polyisopropyl methacrylate, polydodecyl methacrylate, polytetradecyl methacrylate, poly-n-propyl methacrylate, poly-3,3,5-trimethylcyclohexyl methacrylate, polyethyl methacrylate, poly-2-nitro-2-methylpropyl methacrylate, poly-1,1-diethylpropyl methacrylate, and polymethyl methacrylate may be used as the transparent sealing resin.

If necessary, two or more of these thermoplastic resins may be copolymerized or blended.

Examples of a copolymer resin copolymerized with the above resins may include epoxyacrylate, urethane acrylate, polyether acrylate, and polyester acrylate. Especially, the urethane acrylate, the epoxy acrylate, and the polyether acrylate are preferred in view of adhesiveness.

Examples of the epoxy acrylate include (meth)acrylic acid adducts such as 1,6-hexanediol diglycidyl ether, neopentyl glycol diglycidyl ether, allyl alcohol diglycidyl ether, resorcinol diglycidyl ether, adipic acid diglycidyl ester, phthalic acid diglycidyl ester, polyethylene glycol diglycidyl ether, trimethylolpropane triglycidyl ether, glycerin triglycidyl ether, pentaerythritol tetraglycidyl ether, and sorbitol tetraglycidyl ether.

A polymer such as epoxy acrylate which has a hydroxyl group is effective for improving adhesiveness. If necessary, two or more of these copolymer resins may be combined. The resin preferably has a softening temperature of 200° C. or lower and more preferably 150° C. or lower in view of handleability. Considering the use environment temperature of a photovoltaic cell unit of 80° C. or lower and the processability, the resin especially preferably has a softening temperature of from 80° C. to 120° C.

In a case in which a thermoplastic resin is used as the transparent sealing resin, the composition of another resin composition is not specifically limited so long as the resin includes the spherical phosphors. The resin may include a commonly employed component such as, for example, a plasticizer, a flame retardant, and a stabilizer.

Although the transparent sealing resin for the wavelength conversion-type photovoltaic cell sealing material of the present invention may any resin such as photocurable, thermosetting, thermoplastic resins as described above, especially preferred is an ethylene-vinyl acetate copolymer combined with a thermal radical initiator, which is commonly used as a sealing material for a conventional photovoltaic cell.

<Layer Other than Light Emitting Layer>

Although the wavelength conversion-type photovoltaic cell sealing material of the present invention may consist of the light emitting layer which includes the spherical phosphors, preferably, the sealing material further includes a light transmissive layer other than the light emitting layer, in addition to the light emitting layer.

An example of the light transmissive layer other than the light emitting layer includes, for example, a light transmissive support layer which corresponds to the light emitting layer without the spherical phosphors.

The support layer may include the same components as the components of the light emitting layer except for the spherical phosphors. The above description of the transparent sealing resin for the light emitting layer can be applied to the components of the support layer.

In a case in which plural light transmissive layers including the light emitting layer constitute a wavelength conversion-type photovoltaic cell sealing material, the transparent sealing resin in each layer preferably has a refractive index which is at least same as or higher than the index of a layer on the light-receiving side.

In particular, if the plural light transmissive layers are the layer 1, the layer 2 ..., and the layer m having a refractive index $n_1, n_2, \ldots,$ and $n_m$ respectively, the layers preferably has the relation: $n_1 \leq n_2 \leq \ldots \leq n_m$.

Although the wavelength conversion-type photovoltaic cell sealing material of the present invention may have any refractive index, the sealing material preferably has a refractive index of from 1.5 to 2.1 and more preferably from 1.5 to 1.9. In a case in which the wavelength conversion-type photovoltaic cell sealing material of the present invention includes plural light transmissive layers, the wavelength conversion-type photovoltaic cell sealing material preferably has a refractive index within the above range.

Although the sealing material preferably includes only the light emitting layer and the support layer, the sealing material may include a layer other than these layers. An example of such layer includes a light diffusion layer.

<Thickness of Sealing Material>

The light emitting layer and the support layer in the sealing material preferably have a total thickness of from 10 μm to 1000 μm and more preferably from 200 μm to 800 μm, in view of the sealing effect. Additionally, the sealing material preferably has a ratio of the total thickness of the support layer and the light emitting layer to the total thickness t of the light emitting layer of from 0.1% to 80% and more preferably from 1% to 50% in view of costs.

The sealing material preferably has a total thickness of from 10 μm to 1000 μm and more preferably from 200 μm to 800 μm in view of the sealing effect.

The total thickness of the light emitting layer and the support layer and the total thickness of the sealing material can be measured by a method similar to the abovementioned method for measuring the total thickness of the light emitting layer. In a case in which the sealing material includes only the light emitting layer and the support layer, the total thickness of light emitting layer and the support layer can be determined by measuring the total thickness of the sealing material.

<Method for Producing Wavelength Conversion-Type Photovoltaic Cell Sealing Material>

The wavelength conversion-type photovoltaic cell sealing material of the present invention is disposed on the light-receiving surface of a photovoltaic cell element. The sealing material can fully conform to concave and convex geometries of the light-receiving surface of the photovoltaic cell elements, including, for example, the textured surface, an element electrode, and tabbing wires.

The wavelength conversion-type photovoltaic cell sealing material of the present invention is preferably a sheet in view of handleability, and more preferably a sheet which includes the light emitting layer including the spherical phosphors and the support layer including no spherical phosphors.

A method for producing the wavelength conversion-type photovoltaic cell sealing material of the present invention preferably includes the processes of (1) preparing the spherical phosphors, (2) mixing the spherical phosphors with or dispersing the spherical phosphors in the sealing resin to prepare a resin composition, and (3) forming the resin composition into a sheet to produce the light emitting layer as a light transmissive resin composition layer, as well as, if necessary, producing another layer such as the support layer and integrating the layer with the light emitting layer. The method may include another process.

—Process of Preparing Spherical Phosphors—

In the process of preparing the spherical phosphors, the spherical phosphors may be purchased or produced by the abovementioned method.

In particular, the process of preparing the spherical phosphors includes dissolving or dispersing the fluorescent substance in the monomer compound and polymerizing the resultant. In particular, the abovementioned description of the method for producing the spherical phosphors may be applied.

—Process of Preparing Resin Composition—

Examples of a process for mixing the spherical phosphors with or dispersing the spherical phosphors in the sealing resin to prepare a resin composition include, but not limited to, commonly employed processes. The spherical phosphors may be mixed by a roll mixer, plastomill, or the like to uniformly disperse the phosphors in the sealing resin. For example, the spherical phosphors and, if necessary, an additive such as a radical polymerization initiator and a silane coupling agent are added to an ethylene-vinyl acetate copolymer in pellet or powder form, and the resultant is mixed by a roll at 90° C. to give the resin composition.

—Process of Producing Light Emitting Layer—

Examples of a process for forming the resin composition into a sheet to produce the light emitting layer can include, but not limited to, commonly employed processes. In a case in which a thermosetting resin is used as the sealing resin, for example, a heated press can be used to form the resin composition into a partially cured sheet. As described above, the light emitting layer preferably has a thickness of from 10 µm to 600 µm and more preferably from 50 µm to 300 µm.

The composition may be formed into a sheet in a press at 90° C. with a spacer. Use of a spacer having a thickness of about from 0.4 mm to 1.0 mm allows provision of a usable resin composition sheet.

And the surface of the sheet may be embossed. The embossing allows reduction in entrainment of bubbles in the process of producing a photovoltaic cell module.

The resin composition may be formed into a cast film, and the film may be applied onto the inside of a photovoltaic cell or a protective glass to provide at least one layer of the light transmissive layers of a photovoltaic cell module.

The resin composition for forming the cast film is obtained by optionally adding a crosslinking monomer or a photo or thermal polymerization initiator to an acrylic resin polymerized in a solution such as toluene, and blending the spherical phosphors with the mixture.

The mixture of the resin composition is applied onto a film (for example, PET film) which is to be a substrate, using an applicator or the like, and then the applied composition is dried to form a cast film.

—Process of Producing Support Layer—

The support layer is produced as a partially cured sheet in the same manner as the manner for producing the light emitting layer except that the spherical phosphors are not included. Then the support layer is laminated onto the light emitting layer which is a partially cured sheet. In a case in which the sealing material includes any other layer, such other layer is formed into a sheet as described above and laminated onto the side of the support layer without the light emitting layer. After laminating each of the layers, the layers are integrated, for example, under heat and pressure to give the sealing material. The thickness of the support layer is not specifically limited, and may be chosen according to the total thickness of the entire sealing material. As described above, the sealing material preferably has a thickness of from 10 µm to 1000 µm and more preferably from 200 µm to 800 µm in view of the sealing effect.

<<Photovoltaic Cell Module>>

The present invention also encompasses a photovoltaic cell module using the abovementioned wavelength conversion-type photovoltaic cell sealing material.

The photovoltaic cell module of the present invention includes a photovoltaic cell element and the abovementioned wavelength conversion-type photovoltaic cell sealing material, the sealing material disposed on the light-receiving surface of the photovoltaic cell element, as well as, if necessary, another component. Such cell module has improved efficiency of power generation.

The wavelength conversion-type photovoltaic cell sealing material of the present invention is used, for example, as one of the light transmissive layers of a photovoltaic cell module which includes plural light transmissive layers and a photovoltaic cell element.

In the present invention, the photovoltaic cell module includes necessary components such as, for example, an antireflective film, a protective glass, a wavelength conversion-type photovoltaic cell sealing material, a photovoltaic cell element, a back film, an element electrode, and tabbing wires. Among the components, the light transmissive layers having light transmissive property may include, for example, the antireflective film, the protective glass, the wavelength conversion-type photovoltaic cell sealing material of the present invention, a SiNx:H layer and a Si layer, which are a photovoltaic cell element.

In the present invention, the light transmissive layers listed above are usually laminated in the following order from the light-receiving surface of the photovoltaic cell module: the antireflective film which is optionally formed, the protective glass, the wavelength conversion-type photovoltaic cell sealing material of the present invention, the SiNx:H layer, which is a photovoltaic cell element, and the Si layer, which is a photovoltaic cell element.

To allow external light incident at all angles to effectively enter the photovoltaic cell element with low reflective losses, the wavelength conversion-type photovoltaic cell sealing material of the present invention preferably has a refractive index higher than the refractive index of the light transmissive layers disposed closer to the light-receiving side than the wavelength conversion-type photovoltaic cell sealing material, such as the antireflective film and the protective glass, and lower than the refractive index of the light transmissive layers disposed farther from the light-receiving side than the wavelength conversion-type photovoltaic cell sealing material, such as the SiNx:H layer (also referred to as "antireflective film for the element") and the Si layer, which are a photovoltaic cell element.

In particular, the light transmissive layers disposed closer to the light-receiving side than the wavelength conversion-type photovoltaic cell sealing material, i.e., the antireflective film and the protective glass, usually have a refractive index of about from 1.25 to 1.45 and from about 1.45 to 1.55, respectively. The light transmissive layers disposed farther from the light-receiving side than the wavelength conversion-type photovoltaic cell sealing material, i.e., the SiNx:H layer ("antireflective film for the element") and the Si layer, which are a photovoltaic cell element, usually have a refractive index of about from 1.9 to 2.1 and about from 3.3 to 3.4 respectively. According to the above, the wavelength conversion-type photovoltaic cell sealing material of the present invention usually has a refractive index of from 1.5 to 2.1 and preferably from 1.5 to 1.9.

In any cases, it is preferred, for wavelength conversion, to dissolve or disperse the fluorescent substance, preferably a europium complex or a samarium complex, in a monomer, preferably a vinyl monomer; emulsion or suspension polymerize the resultant to provide spherical phosphors; and disperse the spherical phosphors in the transparent sealing resin composition to provide the wavelength conversion-type photovoltaic cell sealing material.

Use, for the wavelength conversion-type photovoltaic cell sealing material of the present invention, of the spherical phosphors having a given relationship between the volume fraction and the number fraction obtained from the particle size distribution curve and a given relationship between the median particle diameter ($D_{50}$) obtained from the volume fraction and the total thickness t of the light emitting layer allows for a photovoltaic cell module with a high efficiency of power generation.

<Photovoltaic Cell Module and Method for Producing Such Module>

A method for producing the photovoltaic cell module includes the processes of preparing the wavelength conversion-type photovoltaic cell sealing material and disposing the wavelength conversion-type photovoltaic cell sealing material on the light-receiving side of a photovoltaic cell element, as well as, if necessary, another process.

—Process of Preparing Wavelength Conversion-Type Photovoltaic Cell Sealing Material—

In the process of preparing the wavelength conversion-type photovoltaic cell sealing material, the wavelength conversion-type photovoltaic cell sealing material may be purchased or produced by the abovementioned method for producing the wavelength conversion-type photovoltaic cell sealing material.

—Process of Disposing Wavelength Conversion-Type Photovoltaic cell Sealing Material—

In particular, the sealing material is disposed by a method similar to a usual method for producing a silicon crystal photovoltaic cell module except that the wavelength conversion-type photovoltaic cell sealing material of the present invention (especially preferably in sheet form) is used in place of a common sealing material sheet.

Generally, in case of a silicon crystal photovoltaic cell module, first, a sealing material sheet (in most cases, formed by imparting thermosetting properties to an ethylene-vinyl acetate copolymer using a thermal radical initiator) is disposed on a cover glass which is to be the light-receiving surface. In the present invention, the wavelength conversion-type photovoltaic cell sealing material of the present invention is used as the sealing material. Next, photovoltaic cell elements connected with tabbing wire are disposed, and the sealing material sheet is disposed with the light emitting layer facing to the light-receiving side (in the present invention, the wavelength conversion-type photovoltaic cell sealing material may be used only on the light-receiving side, and thus a conventional sealing material may be used on the backside). Then a back sheet is disposed, and a vacuum pressure laminator for a photovoltaic cell module is used to provide the photovoltaic cell module.

The heated platen of the laminator has a temperature necessary to soften and melt the sealing material, which encapsulates the photovoltaic cell elements and then is cured. The platen usually has a temperature of from 120° C. to 180° C., and in most cases, from 140° C. to 160° C., and is designed to provide the physical and chemical changes as described above.

EXAMPLES

Herein below, the present invention will be described in more detail with reference to the Examples, although the present invention is not limited to the Examples. Unless otherwise noted, "%" and "part" are by mass.

Example 1

<Synthesis of Fluorescent Substance>
<Synthesis of FTP [1-(4-fluorophenyl)-3-(2-thienyl)-1,3-propanedione]>

0.96 g (0.04 mol) of sodium hydride was weighed out, and 22.5 ml of anhydrous tetrahydrofuran was added under nitrogen atmosphere. A solution of 2.52 g (0.02 mol) of 2-acetyl thiophene and 3.70 g (0.024 mol) of 4-fluorobenzoic acid methyl in 12.5 ml of anhydrous tetrahydrofuran was added dropwise over an hour with vigorous stirring. Then, the resultant was refluxed under nitrogen for 8 hours in a water bath at 76° C. The resultant was cooled to room temperature (25° C.), and 10.0 g of pure water was added. Then 5.0 ml of 3 N hydrochloric acid was added. The organic layer was separated and concentrated under reduced pressure. The concentrate was recrystallized to give 2.83 g of FTP (in 57% yield).

<Synthesis of Eu(FTP)$_3$Phen>

556.1 mg (2.24 mmol) of FTP synthesized as described above and 151.4 mg (0.84 mmol) of 1,10-phenanthroline (Phen) were dispersed in 25.0 g of methanol. To the dispersion, a solution of 112.0 mg (2.80 mmol) of sodium hydroxide in 10.0 g of methanol was added and stirred for an hour.

Then, a solution of 256.5 mg (0.7 mmol) of europium (III) chloride hexahydrate in 5.0 g of methanol was added dropwise. After stirring at room temperature (25° C.) for 2 hours, the precipitate formed was filtered with suction, washed with methanol, and dried to give Eu(FTP)$_3$Phen.

<Production of Spherical Phosphors> 2.14 mg (0.05% by monomer) of Eu(FTP)$_3$Phen as described above, which is the fluorescent substance, and 21.4 mg (0.50% by monomer) of lauroyl peroxide (LPO) were dissolved in 42.86 g of methyl methacrylate (MMA), which is the monomer. The resultant monomer solution was added to 300 g of an aqueous solution including 0.42 g (1.00% by monomer) of polyvinyl alcohol, and after nitrogen bubbling at room temperature (25° C.) under stirring with a stirrer with a half-moon blade at 350 rpm, the resultant was heated to 60° C. under nitrogen and polymerized for 4 hours at the same temperature. Then, the resultant was further heated to 80° C. to remove the remaining radical initiator and stirred for 2 hours to complete the reaction. The resultant was cooled to room temperature (25° C.), and the spherical phosphors formed were filtered off, thoroughly washed with pure water, and dried at 60° C. to give the spherical phosphors.

<Measurement by Particle Size and Shape Image Analyzer>

Figure 1:
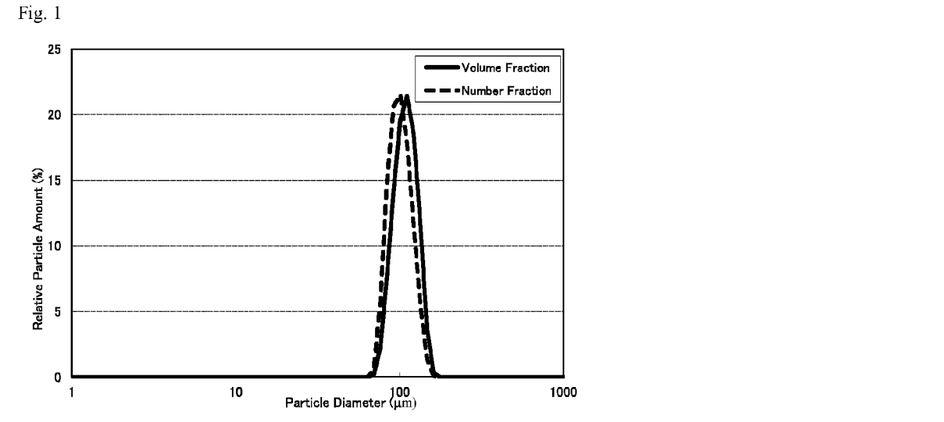
FIG. 1 is a graph showing the volume particle size distribution curve (volume fraction) and the particle number distribution curve (number fraction) of the spherical phosphors in Example 1.

The resultant spherical phosphors were suspended in water and measured for particle size distribution using a laser diffraction scattering particle size distribution analyzer (LS13320 from Beckman Coulter Inc.) to obtain the volume particle size distribution curve (volume fraction) and the particle number distribution curve (number fraction). The results are shown in FIG. 1. The particle diameter of 50% of the volume based cumulative particle size distribution curve (median particle diameter) and the integrated value (N) of particle number distribution in the range of from the particle diameter at 25% of the volume particle size distribution curve to the particle diameter at 75% of the volume particle size distribution curve were determined. The results are shown in Table 1.

The resultant spherical phosphors have been found to have a circularity of at least 0.90, the circularity obtained by measuring 1000 particles using SYSMEX FPIA-3000 particle size and shape image analyzer from Malvern Instruments Limited and analyzing the captured images with the analysis software.

<Preparation of Resin Composition for Wavelength Conversion-Type Photovoltaic Cell Sealing Material>

100 g of NM30PW EVA resin from Tosoh Corp. as the transparent sealing resin (dispersing medium resin), 2 g of TALC (triarylisocyanurate) from Nippon Kasei Chemical Co., Ltd., 1.3 g of LUPEROX 101 peroxide thermal radical initiator from Arkema Yoshitomi, Ltd., 0.5 g of SZ6030 silane coupling agent from Dow Corning Toray Co., Ltd., and 1 g of the spherical phosphors were mixed by a roll mixer at 100° C. to give a resin composition for the wavelength conversion-type photovoltaic cell sealing material.

<Production of Support Layer without Fluorescent Substance (Spherical Phosphor)>

A resin composition was prepared in the same manner as the manner for preparing the resin composition for the wavelength conversion-type photovoltaic cell sealing material, except that the spherical phosphors were not added. 15 g of the resultant resin composition was placed between release sheets and then placed into a press at 90° C. with a stainless spacer to produce a support layer which had a thickness of 450 μm and did not include the fluorescent substance (spherical phosphors). The thickness was determined by measuring the thickness at 5 points using MDH-25M HIGH-ACCURACY DIGIMATIC MICROMETER from Mitutoyo Corp. and averaging the measurements.

<Production of Light Emitting Layer with Fluorescent substance (Spherical Phosphors)>

Using the resin composition for wavelength conversion obtained as described above, a light emitting layer was produced in the same manner as the manner for producing the support layer, except that the thickness of the spacer was changed to give the light emitting layer which had a thickness of 150 μm and included the fluorescent substance (spherical phosphors). The thickness was determined in the same manner as the manner for determining the thickness of the support layer.

<Production of Wavelength Conversion-Type Photovoltaic Cell Sealing Material>

The support layer and the light emitting layer were placed between release sheets and then placed into a press at 90° C. with a stainless spacer to produce a bilayered wavelength conversion-type photovoltaic cell sealing material. The resultant wavelength conversion-type photovoltaic cell sealing material had a thickness of 600 μm. The thickness was determined in the same manner as the manner for determining the thickness of the support layer.

<Production of Sealing Sheet for Back Surface of Photovoltaic Cell>

An sealing sheet for the back surface of a photovoltaic cell was produced in the same composition as the composition for the support layer, except that the sheet had a thickness of 600 μm.

<Production of Wavelength Conversion-Type Photovoltaic Cell Module>

The above wavelength conversion-type photovoltaic cell sealing material was disposed on a tempered glass (from Asahi Glass Co., Ltd.) as a protective glass, with the support layer in contact with the tempered glass, and a photovoltaic cell element which is configured to provide the electromotive force to the exterior was disposed with the light-receiving surface in contact with the light emitting layer. Then the sheet for the back surface of the photovoltaic cell and a PET film (under the trade name of A-4300 from Toyobo Co., Ltd.) as a back film were disposed and laminated using a vacuum pressure laminator for a photovoltaic cell module (LM-50×50-S from NPC Inc.) under the conditions of a platen temperature of 150° C., a vacuum time of 10 minutes, and a pressure time of 15 minutes to produce the photovoltaic cell module of Example 1.

<Evaluation of Properties of Photovoltaic Cell Module>

A solar simulator (WXS-155S-10, AM1.5G from Wacom Electric Co., Ltd.) was used as simulated solar radiation, and the short-circuit current density Jsc of the photovoltaic cell element before and after sealing the module was measured using an I-V curve tracer (MP-160 from EKO Instruments Co., Ltd.), and the ratio of the Jsc after the encapsulation to the Jsc before the encapsulation was determined to evaluate the current-voltage characteristics. The short-circuit current density Jsc was measured according to JIS-C-8912. The result is shown in Table 1, together with the results on the Comparative Examples. The density was measured without use of the UV filter of the solar simulator.

Comparative Example 1

<Production of Spherical Phosphors> 0.15 g (0.05% by monomer) of fluorescent substance Eu (FTP)$_3$Phen synthesized in the same manner as in Example 1 and 1.53 g (0.50% by monomer) of lauroyl peroxide (LPO) were dissolved in 300 g of methyl methacrylate (MMA). The resultant monomer solution was added to 300 g of an aqueous solution including 3 g (1.00% by monomer) of polyvinyl alcohol and stirred with a homogenizer for a minute at 3000 rpm to give a suspension. After nitrogen bubbling at room temperature under stirring with a stirrer with an FD blade at 300 rpm, the suspension was heated to 60° C. under nitrogen, and polymerized for 4 hours at the same temperature. Then, the resultant was further heated to 80° C. to remove the remaining radical initiator and stirred for 2 hours to complete the reaction. The resultant was cooled to room temperature (25° C.), and the spherical phosphors formed were filtered off, thoroughly washed with pure water, and dried at 60° C. to give the spherical phosphors.

Figure 2:
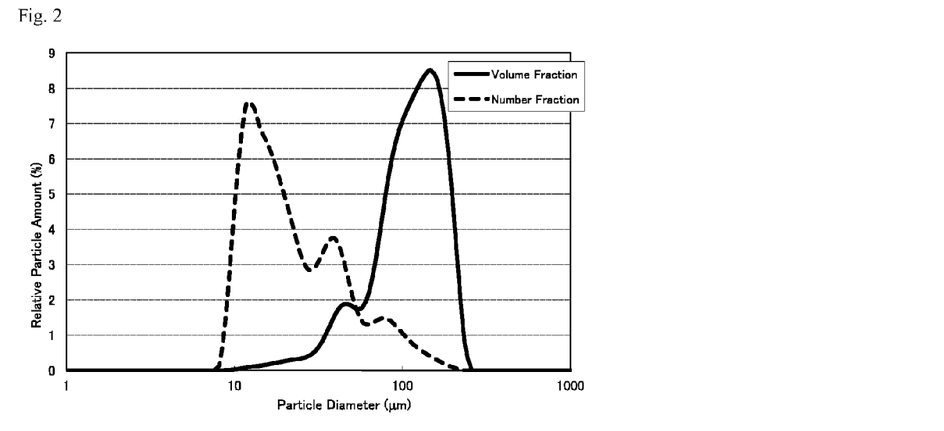
FIG. 2 is a graph showing the volume particle size distribution curve (volume fraction) and particle number distribution curve (number fraction) of the spherical phosphors in the Comparative Example 1.

The volume particle size distribution curve, the particle number distribution curve, the median particle diameter $D_{50}$, the integrated value N, and the Jsc ratio were determined in the same manner as the manner described above. The volume particle size distribution curve (volume fraction) and the particle number distribution curve (number fraction) are shown in FIG. 2, and the median particle diameter $D_{50}$, the integrated value N, and the Jsc ratio are shown in Table 1.

Comparative Example 2

<Production of Spherical Phosphors> 0.15 g (0.05% by monomer) of Eu(FTP)$_3$Phen prepared as described above as the fluorescent substance, 300 g of methyl methacrylate (MMA), and 0.012 g of n-octane thiol as a chain transfer agent were mixed and stirred to prepare a monomer mixture. 300 g of ion-exchanged water and 3.65 g of sodium alkylbenzene sulfonate G-15 from Kao Corp. as a surfactant were mixed, and to the mixture, the monomer mixture is added and kept at 60° C. under stirring in a flask equipped with a reflux condenser under nitrogen. 0.03 g of potassium persulfate as a radical polymerization initiator was added, and emulsion polymerization was carried out for 4 hours. The resultant was heated to 90° C. to complete the polymerization reaction. The resultant was cooled to room temperature (25° C.). The spherical phosphors formed were filtered off, thoroughly washed with isopropyl alcohol, and dried at 60° C. to give spherical phosphors.

Figure 3:
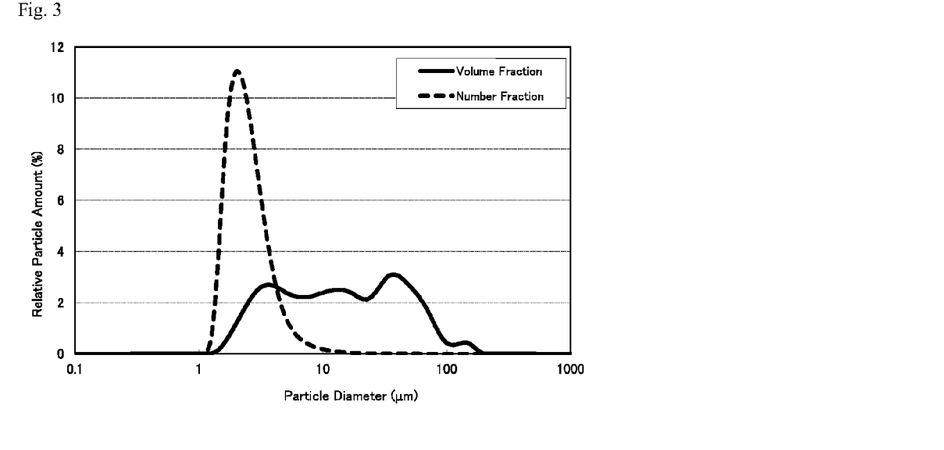
FIG. 3 is a graph showing the volume particle size distribution curve (volume fraction) and the particle number distribution curve (number fraction) of the spherical phosphors in Comparative Example 2.

The volume particle size distribution curve, the particle number distribution curve, the median particle diameter $D_{50}$, the integrated value N, and the Jsc ratio were determined in the same manner as the manner described above. The volume particle size distribution curve (volume fraction) and the particle number distribution curve (number fraction) are shown in FIG. 3, and the median particle diameter $D_{50}$, the integrated value N, and the Jsc ratio are shown in Table 1.

TABLE 1

| | Median Particle Diameter of Spherical Phosphor ($D_{50}$) (μm) | Integrated Value N of Particle Number Distribution in the Range of from $D_{25}$ to $D_{75}$ (%) | Jsc Ratio (mA/cm$^2$) |
|---|---|---|---|
| Example 1 | 114 | 29.4 | 1.02 |
| Comparative Example 1 | 121 | 4.7 | 0.99 |

TABLE 1-continued

| | Median Particle Diameter of Spherical Phosphor ($D_{50}$) (μm) | Integrated Value N of Particle Number Distribution in the Range of from $D_{25}$ to $D_{75}$ (%) | Jsc Ratio (mA/cm$^2$) |
|---|---|---|---|
| Comparative Example 2 | 14 | 4.0 | 1.00 |

As shown in Table 1, although Example 1 has a median particle diameter similar to the median particle diameter of Comparative Example 1, Example 1 has a larger cumulative distribution N ($D_{25}$-$D_{75}$) (more than 5%) and thus includes a smaller number of particles with a small particle size. It is believed that because the spherical phosphors of Example 1 have a median particle diameter ($D_{50}$) of not less than a tenth of the thickness of the light emitting layer (t: 150 μm) (not less than 15 μm), the phosphors are less likely to overlap in the thickness direction of the light emitting layer. It has been found that this allows prevention of scattering of light and thus improvement in conversion efficiency. Therefore, it has been confirmed that light is prevented from scattering in the excitation wavelength range, and thus the efficiency of power generation is improved.

The disclosure of Japanese Patent Application No. 2011-036964 filed on Feb. 23, 2011 is herein incorporated by reference in its entirety.

All publications, patent applications, and technical specifications described herein are herein incorporated by reference to the same extent as if individual publication, patent application, and technical specification were specifically and individually indicated to be incorporated by reference.

The invention claimed is:

1. A wavelength conversion-type photovoltaic cell sealing material, the sealing material comprising at least one light emitting layer containing a group of spherical phosphors, the group of spherical phosphors having a ratio of a median value $D_{50}$ of the group of spherical phosphors to a total thickness t of the light emitting layer of from 0.1 to 1.0, where the median value $D_{50}$ is a median value of a volume particle size distribution of the group of spherical phosphors, and an integrated value N of a number particle size distribution from $D_{25}$ to $D_{75}$ of the group of spherical phosphors being 5% or more when $D_{25}$ is a particle size value at 25% of an integrated value of the volume particle size distribution of the group of spherical phosphors and $D_{75}$ is a particle size value at 75% of the integrated value of the volume particle size distribution of the group of spherical phosphors.

2. The wavelength conversion-type photovoltaic cell sealing material according to claim 1, wherein a median particle diameter $D_{50}$ of the group of spherical phosphors is from 1 μm to 600 μm.

3. The wavelength conversion-type photovoltaic cell sealing material according to claim 1, wherein a total thickness of the light emitting layer is from 10 μm to 600 μm.

4. The wavelength conversion-type photovoltaic cell sealing material according to claim 1, wherein a spherical phosphor included in the group of spherical phosphors comprises a fluorescent substance and a transparent material.

5. The wavelength conversion-type photovoltaic cell sealing material according to claim 1, wherein the transparent material comprises at least one selected from the group consisting of an acrylic resin, a methacrylic resin, a urethane resin, an epoxy resin, a polyester, a polyethylene, and a polyvinyl chloride.

6. The wavelength conversion-type photovoltaic cell sealing material according to claim 1, further comprising a light transmissive layer other than the light emitting layer.

7. The wavelength conversion-type photovoltaic cell sealing material according to claim 1, wherein a total thickness of the sealing material is from 10 μm to 1000 μm.

8. The wavelength conversion-type photovoltaic cell sealing material according to claim 1, wherein a spherical phosphor included in the group of spherical phosphors comprises a fluorescent substance and a transparent material, and a content amount of the fluorescent substance in the spherical phosphor is from 0.001 parts by mass to 30 parts by mass based on 100 parts by mass of the transparent material.

9. The wavelength conversion-type photovoltaic cell sealing material according to claim 1, wherein a spherical phosphor included in the group of spherical phosphors comprises at least one fluorescent substance selected from the group consisting of an organic fluorescent substance, an inorganic fluorescent substance, and a rare earth metal complex.

10. The wavelength conversion-type photovoltaic cell sealing material according to claim 1, wherein a spherical phosphor included in the group of spherical phosphors comprises a rare earth metal complex as a fluorescent substance, and the rare earth metal complex is at least one selected from the group consisting of a europium complex and a samarium complex.

11. A photovoltaic cell module, comprising a photovoltaic cell element and the wavelength conversion-type photovoltaic cell sealing material according to any one of claims 1 to 10, wherein the sealing material is disposed on a light-receiving surface of the photovoltaic cell element.

* * * * *